United States Patent

Shepard, Jr. et al.

[11] Patent Number: 5,551,983
[45] Date of Patent: Sep. 3, 1996

[54] METHOD AND APPARATUS FOR DEPOSITING A SUBSTANCE WITH TEMPERATURE CONTROL

[75] Inventors: Cecil B. Shepard, Jr., Laguna Niguel; Michael S. Heuser, Foothill Ranch; Daniel V. Raney, Mission Viejo; William A. Quirk, Lake Forest; Gregory Bak-Boychuk, San Juan Capistrano, all of Calif.

[73] Assignee: Celestech, Inc., Irvine, Calif.

[21] Appl. No.: 332,832

[22] Filed: Nov. 1, 1994

[51] Int. Cl.$^6$ ................................ C23C 16/00
[52] U.S. Cl. ................ 118/723 R; 118/725; 118/728; 118/730
[58] Field of Search ................ 118/725, 723 R, 118/728, 730

[56] References Cited

U.S. PATENT DOCUMENTS

| | | | |
|---|---|---|---|
| 3,845,739 | 11/1974 | Erhart et al. | 118/49.1 |
| 4,401,054 | 8/1983 | Matsuo et al. | 118/723 |
| 4,471,003 | 9/1984 | Cann | 427/34 |
| 4,487,162 | 12/1984 | Cann | 118/723 |
| 4,505,947 | 3/1985 | Vukanovic et al. | 427/34 |
| 4,507,588 | 3/1985 | Asmussen et al. | 315/39 |
| 4,585,668 | 4/1986 | Asmussen et al. | 427/38 |
| 4,596,718 | 6/1986 | Gruner | 427/34 |
| 4,630,566 | 12/1986 | Asmussen et al. | 118/50.1 |
| 4,691,662 | 9/1987 | Roppel et al. | 118/50.1 |
| 4,728,863 | 3/1988 | Wertheimer | 315/111.21 |
| 4,913,090 | 4/1990 | Harada et al. | 118/724 |
| 4,987,002 | 1/1991 | Sakamoto et al. | 427/34 |
| 5,063,031 | 11/1991 | Sato | 422/245 |
| 5,068,871 | 11/1991 | Uchida et al. | 373/17 |
| 5,094,878 | 3/1992 | Yamamoto et al. | 427/37 |
| 5,104,634 | 4/1992 | Calcote | 423/446 |
| 5,108,779 | 4/1992 | Gasworth | 427/39 |
| 5,132,105 | 7/1992 | Remo | 423/446 |
| 5,204,144 | 4/1993 | Cann et al. | 427/569 |
| 5,204,145 | 4/1993 | Gasworth | 427/577 |
| 5,226,383 | 7/1993 | Bhat | 118/730 |
| 5,318,801 | 6/1994 | Snail et al. | 427/248.1 |
| 5,342,660 | 4/1994 | Cann et al. | 427/577 |

FOREIGN PATENT DOCUMENTS

| | | |
|---|---|---|
| 59-21026 | 2/1984 | Japan . |
| 59-43861 | 3/1984 | Japan . |
| 63-289926 | 11/1988 | Japan . |
| 01-242141 | 9/1989 | Japan . |
| 01-312008 | 12/1989 | Japan . |
| 02-60103 | 2/1990 | Japan . |
| 02-167891 | 6/1990 | Japan . |

*Primary Examiner*—Richard Bueker
*Attorney, Agent, or Firm*—Martin Novack

[57] ABSTRACT

An apparatus for depositing a substance with temperature control includes, in one embodiment: a mandrel rotatable on an axis; a spacer mounted on the mandrel; a substance mounted on the spacer; a plasma, containing constituents of the substance being deposited, directed toward the substrate; the spacer having a thermal conductance in its thickness direction that varies with radial dimension.

19 Claims, 10 Drawing Sheets

METHOD AND APPARATUS FOR DEPOSITING A SUBSTANCE WITH TEMPERATURE CONTROL

FIELD OF THE INVENTION

This invention relates to temperature control during material deposition and, more particularly, to controlling temperature of a substance being deposited on a surface. The invention is especially applicable to deposition of diamond by plasma jet on a rotating surface.

BACKGROUND OF THE INVENTION

Techniques have long been known for depositing substances, such as layers of semiconductor material, using a plasma that is formed into a jet. For example, U.S. Pat. Nos. 4,471,003 and 4,487,162 disclose arc jet plasma deposition equipments which utilize a plasma for deposition of semiconductors and other materials. Ions and electrons are obtained by injecting an appropriate compound, such as a silicon compound, into an arc region, and a jet (or beam) is formed by utilizing magnetic fields to accelerate and focus the plasma. Recently, equipment of this type has been used to deposit synthetic diamond. Superior physical and chemical properties make diamond desirable for many mechanical, thermal, optical and electronic applications, and the ability to deposit synthetic diamond by plasma jet deposition holds great promise, particularly if plasma jet techniques can be improved for this and other purposes. A plasma of a hydrocarbon and hydrogen can be obtained using electrical arcing, and the resultant plasma focused and accelerated toward a substrate, using focusing and accelerating magnets, so that polycrystalline diamond film is deposited on the substrate. Reference can be made, for example, to U.S. Pat. No. 5,204,144, assigned to the same assignee as the present Application, for description of an example of a type of plasma jet deposition that can be utilized to deposit synthetic diamond on a substrate.

In various commercial applications it is desirable to have relatively large size diamond films. In plasma jet deposition techniques there are various factors which limit the practical size of the deposition area that is active on a substrate at a particular moment. For example, when an arc is employed to generate the heated gas mixture in an arc jet plasma deposition system, the diameter of the beam can be limited by a number of factors. Since the cross-section of the plasma beam is generally limited in practical applications, the area on which it is desired to deposit a diamond film may be larger than the deposition beam. This means that it may be desirable to move the beam and the target substrate with respect to each other during the deposition process. This has been achieved by spinning the substrate during deposition, which helps to promote temperature uniformity over the substrate, as well as to attain larger area substrate coverage (see e.g. the referenced U.S. Pat. No. 5,204,144)

In plasma jet deposition of the type described, it is typically necessary to cool the substrate (or mandrel) upon which the diamond is being deposited, to prevent the hot plasma from overheating the deposition surface, and to provide an optimum deposition temperature for the particular product characteristics desired. A coolant can be circulated in the mandrel to provide cooling. In a rotating mandrel type of deposition equipment, as described in U.S. Pat. No. 5,204,144, cooling fluid can be circulated through a rotating union. FIG. 1 illustrates a prior art type of configuration wherein a rotatable mandrel 110, coupled with a rotary union 115, is rotated, such as by a belt or gear drive (not shown), and coolant fluid can be circulated through the mandrel, in the direction indicated by the arrows, or in the opposite direction. A disc-shaped spacer 150 and substrate 170 are shown as being mounted on the rotating mandrel.

Although the described type of cooling and spinning of the substrate can be effective in obtaining a suitable temperature that is generally uniform azimuthally, temperature at the deposition surface of a disc-shaped substrate can vary substantially in the radial direction, due to factors such as variation in heating by the beam as a function of its cross section.

It is among the objects of the present invention to provide improved temperature control, such as to achieve temperature uniformity, in a plasma deposition apparatus, such as the type used for deposition of synthetic diamond. It is also among the objects of the present invention to provide temperature control in a deposition system in which a substance, such as synthetic diamond, is being deposited on a rotating mandrel or substrate.

SUMMARY OF THE INVENTION

The present invention is directed to an apparatus and technique for use in systems where a substance is being deposited on a mandrel or substrate, and where it is desirable to control temperature at the deposition surface. In many applications it is desirable to obtain spatial and temporal temperature uniformity over the deposition surface, but the invention is also applicable to situations where it is desirable to obtain a particular temperature pattern at the deposition surface. The deposition technique may require heating or cooling of the deposition surface, with cooling being necessary or desirable for most plasma deposition applications, such as deposition of synthetic diamond film, which is an important application of the invention. The invention is also particularly advantageous in systems where the mandrel (which may have a substrate mounted thereon) is rotated during deposition. The above referenced U.S. Pat. No. 5,204,144 discloses a plasma jet deposition system wherein the deposition surface is rotated at a relatively high rate, and this facilitates obtaining temperature uniformity on the surface, particularly where the depositing plasma jet has a smaller cross-sectional area than the surface on which the substance (e.g. diamond) is being deposited. As first noted above, however, temperature uniformity in the radial direction could stand improvement, and a feature of the invention achieves this objective.

In accordance with one form of the invention, temperature control at the surface of a substrate, such as a substrate rotating on a cooled mandrel, is controlled by using a special type of spacer. In an embodiment of this form of the invention, there is provided an apparatus for depositing a substance, which comprises: a mandrel rotatable on an axis; a spacer mounted on the mandrel; a substrate mounted on the spacer; means for directing, toward the substrate, a plasma containing constituents of the substance being deposited; the spacer having a thermal conductance in its thickness direction that varies with radial dimension. In a preferred embodiment of this form of the invention, the thermal conductance of the spacer in the thickness direction varies by at least 5 percent from minimum to maximum.

An advantage of the summarized feature of the invention is that the radial temperature profile on the deposition surface can be better controlled. For example, in a situation where the center of the substrate tends to be hotter than the outside thereof, and where temperature uniformity is desired, a spacer having greater thermal conductance toward the center can provide effectively greater heat exchange near the center (by providing a higher thermal conductance path for heat exchange with the cooled mandrel near the center of the substrate), or vice versa for the opposite situation. In one preferred embodiment of this form of the invention, the spacer comprises a disc having concentric grooves therein. For a metal spacer, the metal will generally have much higher thermal conductivity than the open space of the grooves, so by providing, for example, more groove volume near the center of the spacer, the thermal conductance thereof will be higher toward the periphery of the spacer. In this example, if the mandrel would otherwise tend to provide relatively uniform heat exchange over its surface, the result will be more cooling toward the center, where the thermal conductance of the spacer (in the thickness direction) is higher. The thermal conductance of the spacer, in the thickness direction, can vary linearly or non-linearly with radial dimension. In accordance with a further feature of the invention, the radial heat flux characteristic at the deposition surface is determined, and a spacer is provided that has a thermal conductivity in its thickness direction that varies in accordance with (i.e., inversely with, for most situations) the determined radial heat flux characteristic.

While spinning of a mandrel (or a mandrel with a substrate thereon) is advantageous in obtaining temperature uniformity on its deposition surface, there can be practical difficulties in reliably providing heat exchange (typically, a cooling fluid) to and from a rotating mandrel to remove heat therefrom. A further form of the disclosure addresses this problem. In accordance with an embodiment of this form of the disclosure, there is provided a method for depositing diamond film that includes the following steps: providing a deposition chamber; providing, in the chamber, a rotating mandrel; directing a plasma containing a hydrocarbon gas and hydrogen gas toward the mandrel; and controlling temperature on the surface of the mandrel by passing coolant fluid radially through the mandrel at several angular reference positions in the mandrel. In a disclosed embodiment, the step of passing coolant fluid radially through the mandrel comprises providing radial bores through the mandrel at several angular reference positions. In this embodiment, the fluid is hydrogen, and the fluid enters the environment of the chamber after passing radially through the mandrel to the periphery of the mandrel. Since most of the environment of the chamber is hydrogen, permitting hydrogen gas to enter the chamber does not contaminate the deposition environment. An advantage of this feature is that it becomes unnecessary to return the heat exchange fluid through a rotating seal, as the hydrogen in the chamber is ultimately handled by the vacuum system that controls the chamber pressure. In a further embodiment the fluid is passed through the mandrel at an angle with respect to the surface of the mandrel. Preferably, the angle is at least 2 degrees with respect to the plane of the mandrel surface. In this manner, heat exchange can be varied radially. For example, depending on the direction of the taper with respect to the mandrel surface, the heat exchange can be concentrated either more toward the center of rotation of the mandrel or more toward the periphery of the mandrel.

Further features and advantages of the invention will become more readily apparent from the following detailed description when taken in conjunction with the accompanying drawings.

DETAILED DESCRIPTION

Figure 2:
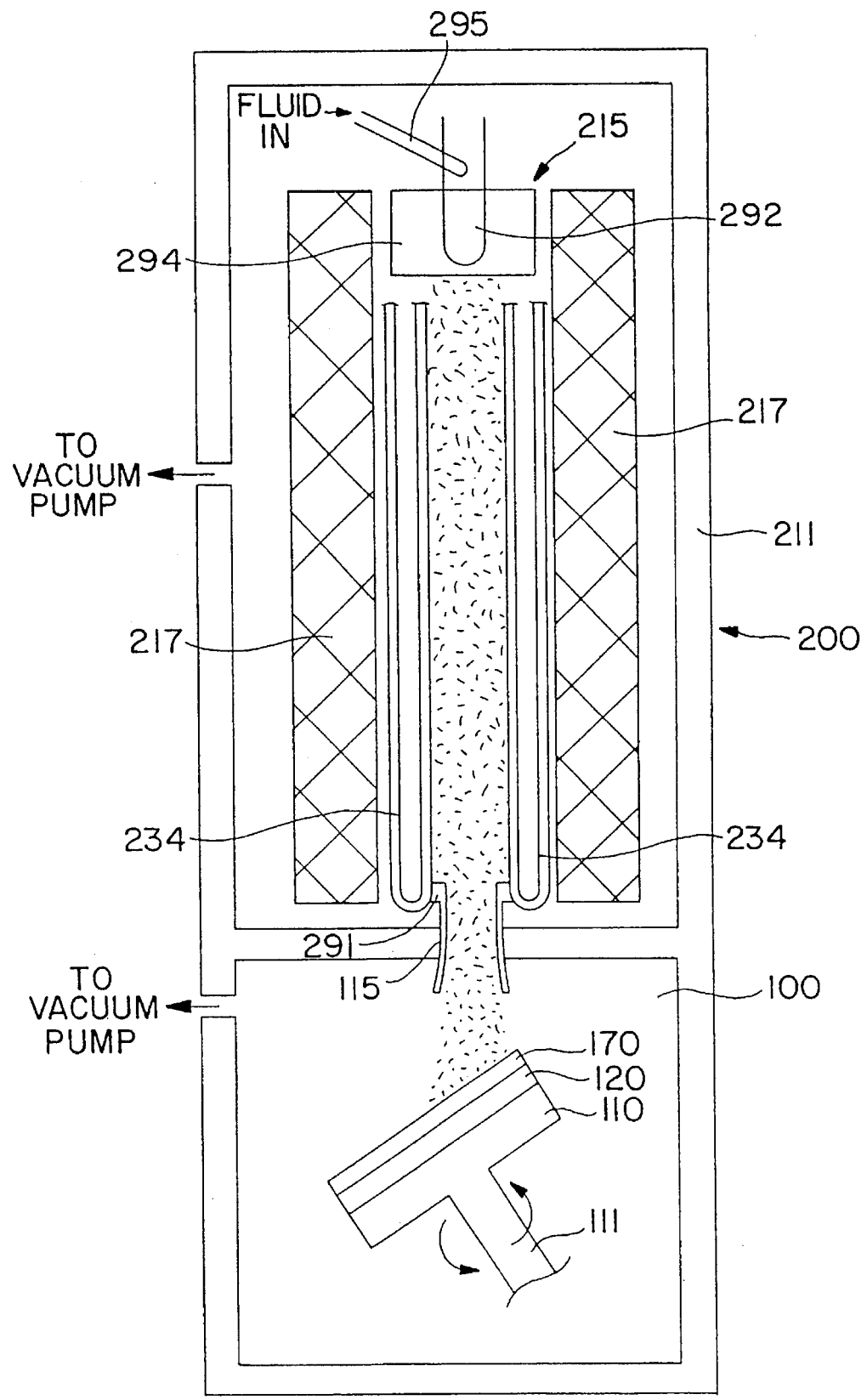
FIG. 2 is a schematic diagram, partially in block form, of an apparatus in accordance with the invention, and which can be used to practice the method of the invention.

Referring to FIG. 2, there is shown a chemical vapor deposition ("CVD") apparatus of a type which can be utilized in practicing embodiments of the invention. A deposition chamber 100 is the lower section of a plasma jet CVD deposition system 200, evacuated by one or more vacuum pumping systems (not shown).

The system 200 is contained within a vacuum housing 211 and includes an arc-forming section 215 which comprises a cylindrical holder 294, a rod-like cathode 292, and an injector 295 mounted adjacent to the cathode so as to permit injected fluid to pass over the cathode. A cylindrical anode is provided at 291. In the illustrated system, where synthetic diamond is to be deposited, the input fluid may be, for example, a mixture of hydrogen and methane. The methane could alternatively be fed in downstream. The anode 291 and cathode 292 are energized by a source of electrical power (not shown), for example a DC potential. Cylindrical magnets, designated by reference numeral 217, are utilized to help control the plasma generation. A nozzle, represented at 115, can be used to control beam size, within limitations. Optional cooling coils 234, in which a coolant can be circulated, can be located within the magnets.

In an example of operation, a mixture of hydrogen and methane is fed into the injector 295, and a plasma is obtained in front of the arc forming section and accelerated and focused toward the deposition region at which a substrate is located. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003, 4,487,162, and 5,204,144. It will be understood that other suitable types of deposition equipment, including, for example, other types of CVD plasma deposition equipment, or physical vapor deposition equipment, can be used in conjunction with the features of the invention to be described.

Figure 1:
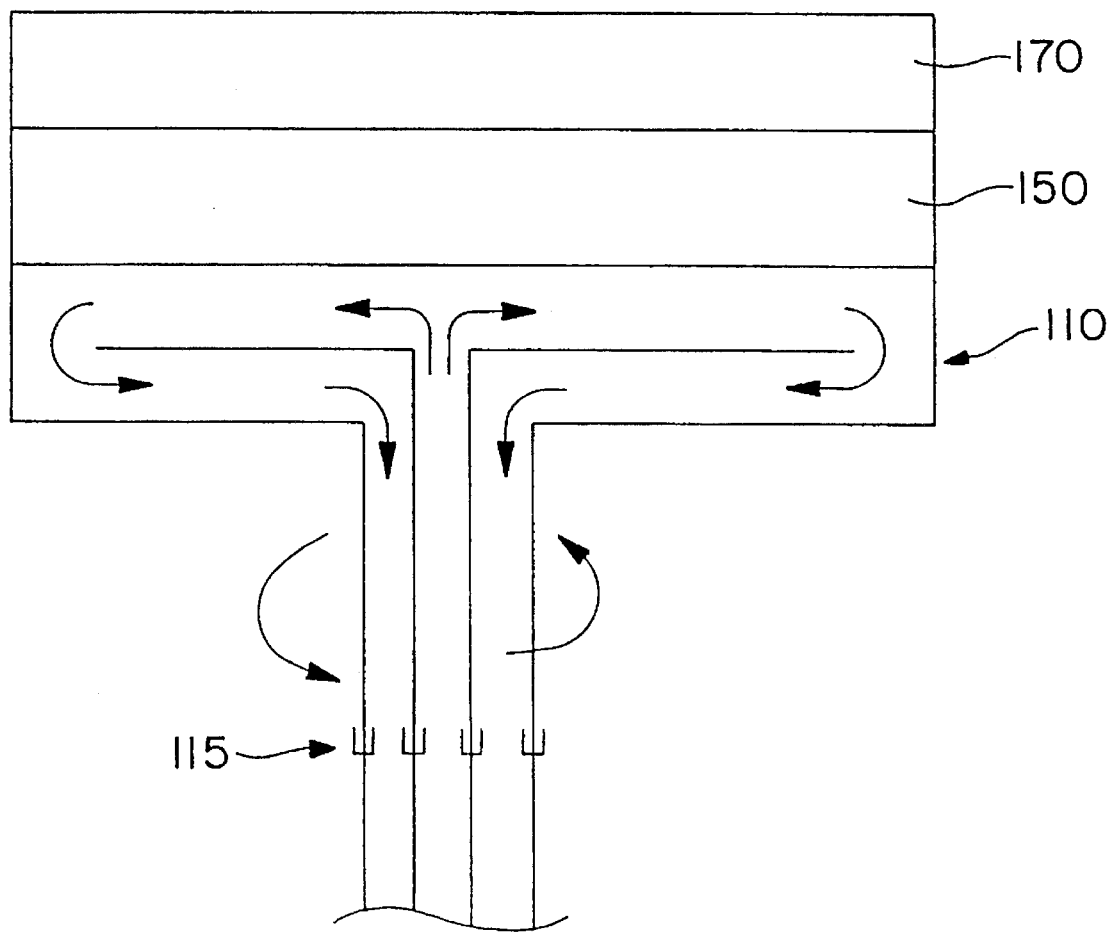
FIG. 1 is a simplified cross-sectional diagram which illustrates a prior art rotating mandrel assembly with heat exchange.

A mandrel 110 is rotatable on a shaft 111, and has a spacer 120 and a substrate 170 mounted thereon (by means not shown, bolting or clamping being typical). The mandrel 110 can be cooled by any suitable means, for example by using a heat exchange fluid (e.g. water) that is circulated through the mandrel, as in the prior art arrangement first illustrated in FIG. 1. The mandrel can be tilted with respect to the direction of the plasma jet, as disclosed in U.S. Pat. No. 5,342,660. The heat exchange fluid can be fed and returned through a rotary union, as shown in FIG. 1, and a suitable motor (not shown) can be used for rotating the shaft, as is also disclosed in U.S. Pat. No. 5,342,660. The rotational drive will conventionally be above the rotary union.

Figure 3:
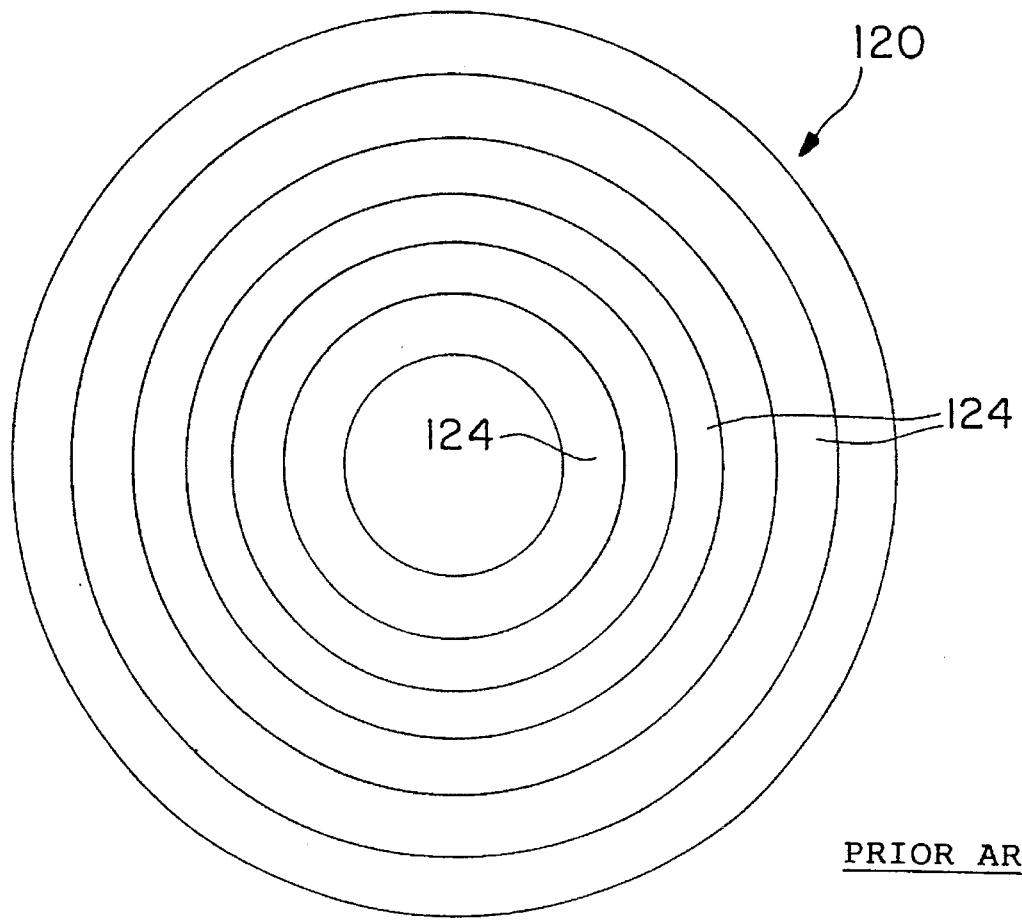
FIG. 3 is a plan view of a spacer with uniformly spaced grooves.
Figure 4:
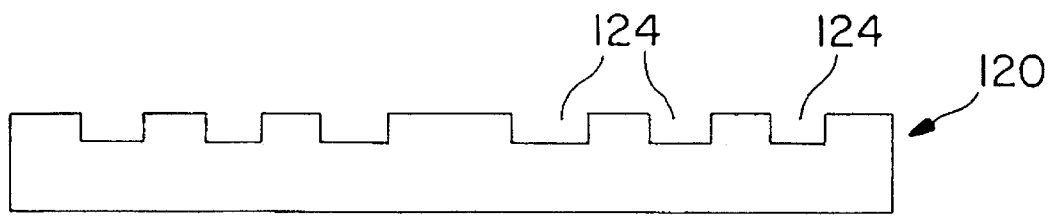
FIG. 4 is a cross-sectional view of the FIG. 3 spacer, as taken through a section defined by arrows 4—4 of FIG. 3.

FIGS. 3 and 4 illustrate, respectively, a plan view and a cross-sectional view of a spacer disc 120 which may be formed, for example, of metal (for example molybdenum or titanium), graphite, or ceramic, and has a plurality of concentric annular grooves 121 formed therein, such as by machining. The grooves can be empty, or can be filled with a material having a different thermal conductivity than the rest of the spacer disc. In the configuration of FIGS. 3 and 4, the grooves are uniformly spaced so that variation in thermal conductance in the thickness direction, as a function of radius, will be local, and will result in an overall lower thermal conductance of the spacer (as compared to a solid spacer), since the open grooves have a lower thermal conductivity than the solid material of the disc. This generally symmetrical configuration will tend to result in macroscopically uniform thermal conductance, in the thickness direction, as a function of radial dimension. [The "ripple" in conductance over relatively short radial distance will tend to be smoothed by the remaining spacer thickness and substrate thickness.] The configuration of FIGS. 3 and 4 is prior art.

Figure 5:
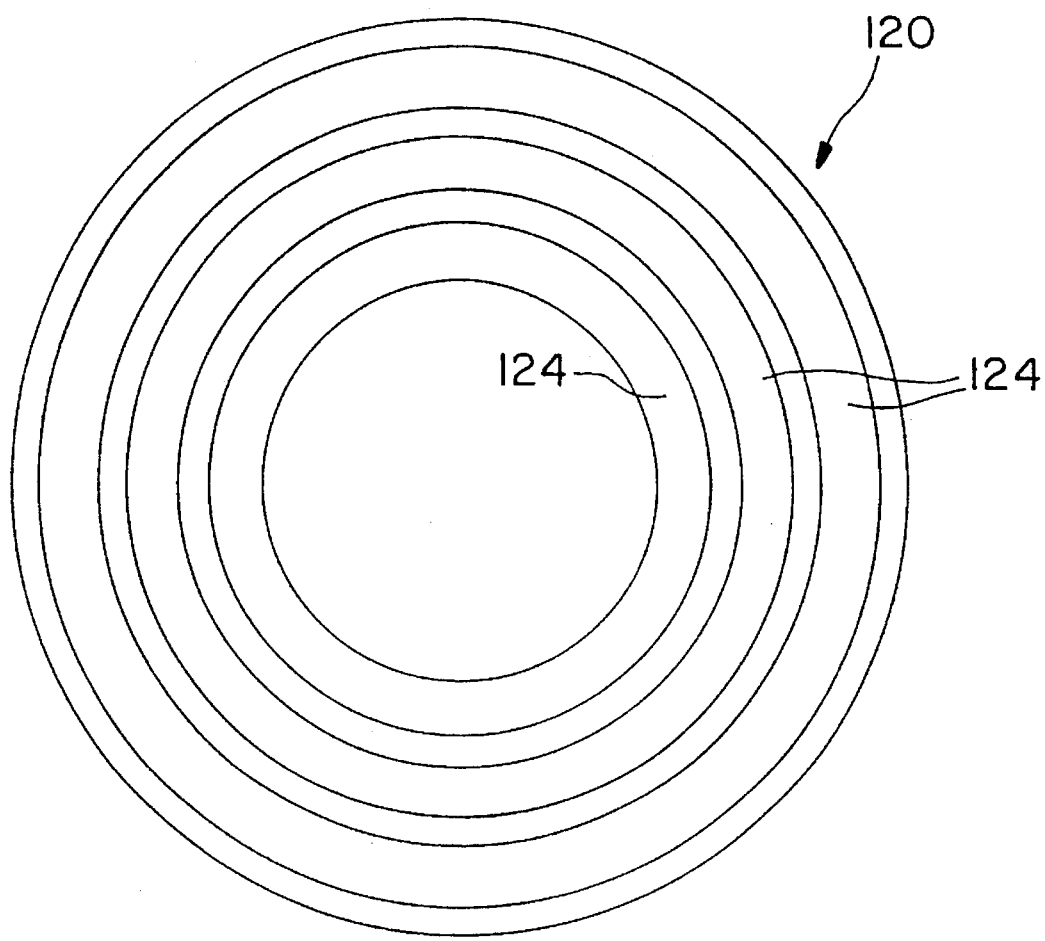
FIG. 5 is a plan view of another spacer, in accordance with an embodiment of the invention.
Figure 6:
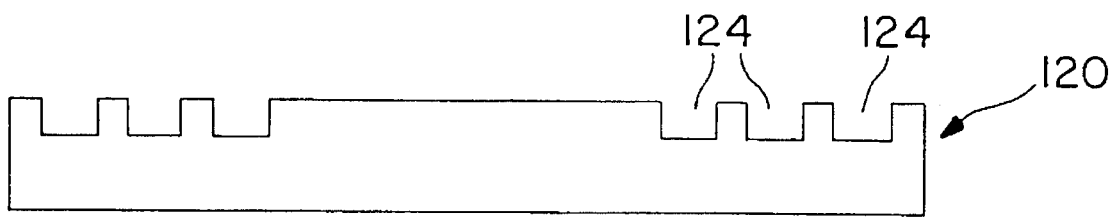
FIG. 6 is a cross-sectional view of the FIG. 5 spacer, as taken through a section defined by the arrows 6—6 of FIG. 5.

FIGS. 5 and 6 illustrate a configuration in accordance with the invention that results in greater thermal conductance (and, accordingly, more heat transfer) near the center than near the periphery of the spacer. This is achieved by providing more groove volume (greater cross-sectional area and/or greater groove depth) near the outside of the spacer, such as by providing more grooves or wider grooves or deeper grooves near the periphery. [The illustration of FIG. 5 has more grooves near the periphery.] Thus, for example, in a plasma deposition system of the type illustrated in FIG. 2, there may typically tend to be a substantial radial temperature gradient caused by the plasma beam, with the center of the substrate usually having a higher temperature than the periphery of the substrate. If the mandrel is cooled relatively uniformly, and if one uses a prior art configuration such as that of FIG. 1 (with a solid spacer, or, for example, with no spacer) there may be a substantial radial temperature gradient, which could result in non-uniform diamond deposition and quality. Using a spacer of the type shown in FIGS. 5 and 6 between a cooled mandrel and a substrate will tend to provide more efficient cooling toward the center of the substrate, as the grooves reduce thermal conduction from substrate to cooled mandrel near the periphery. Thus, a more uniform radial temperature characteristic can be achieved by using this form of the invention. The groove pattern can be designed to obtain the desired thermal conductivity characteristic. A supply of spacers, having different thermal conductivity characteristics in their thickness direction, as a function of radial dimension, can be provided for use in different situations and to "match" the inverse of the expected radial temperature gradient on the substrate deposition surface.

Figure 7:
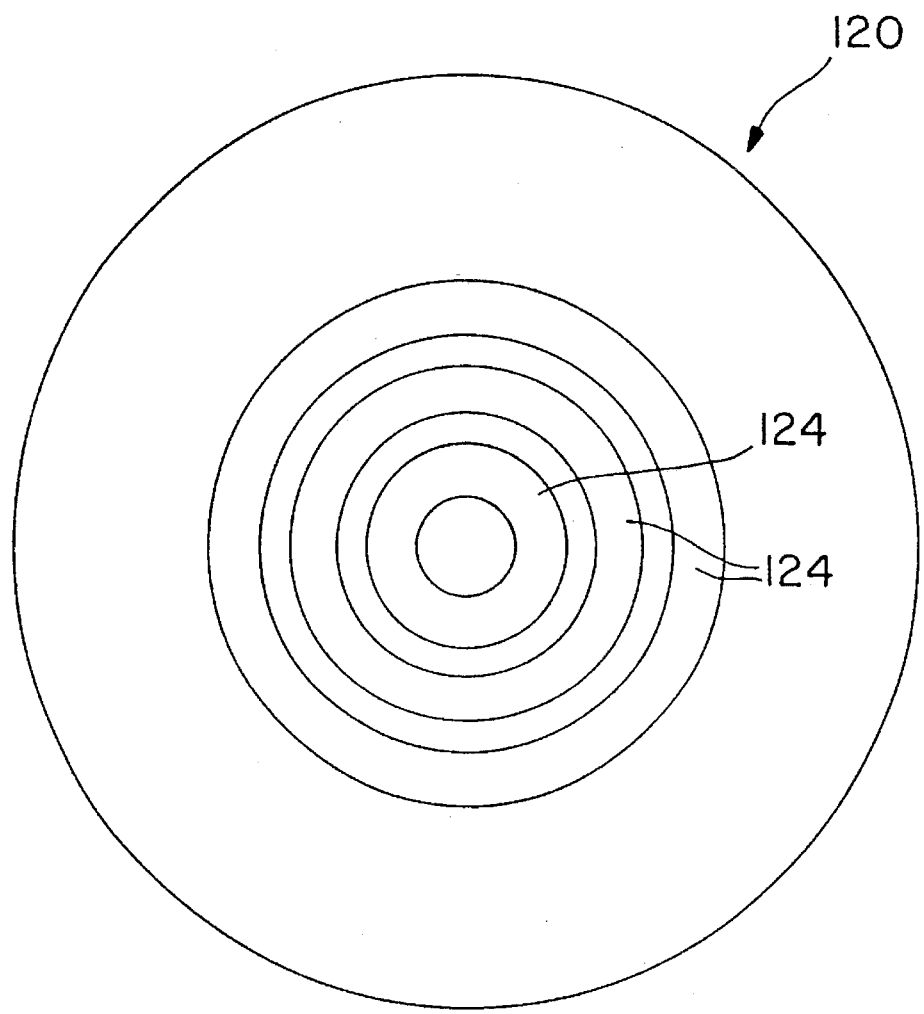
FIG. 7 is a plan view of another spacer, in accordance with an embodiment of the invention.
Figure 8:
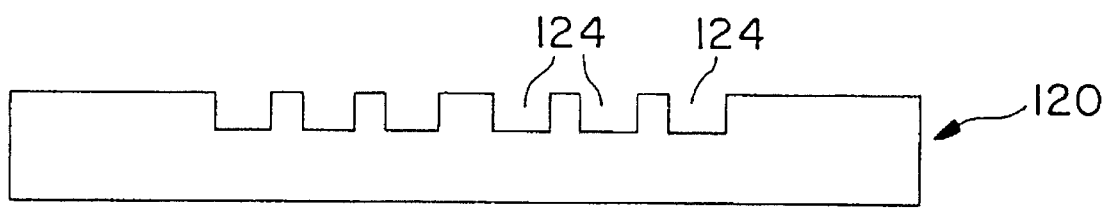
FIG. 8 is a cross-sectional view of the FIG. 7 spacer, as taken through a section defined by the arrows 8—8 of FIG. 7.

FIGS. 7 and 8 illustrate the opposite case; that is, a spacer configuration which has relatively less thermal conductivity (in the thickness direction) toward the center of the spacer disc and relatively greater thermal conductivity toward the periphery thereof.

Figure 9:
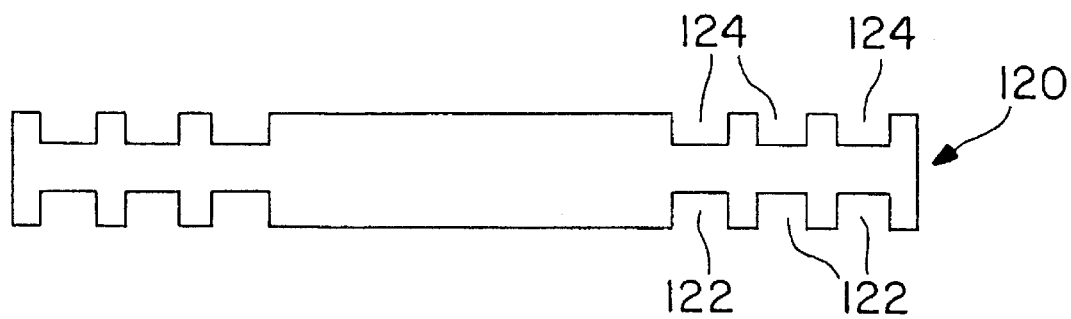
FIG. 9 is a cross-sectional view of a spacer in accordance with a further embodiment of the invention.
Figure 10:
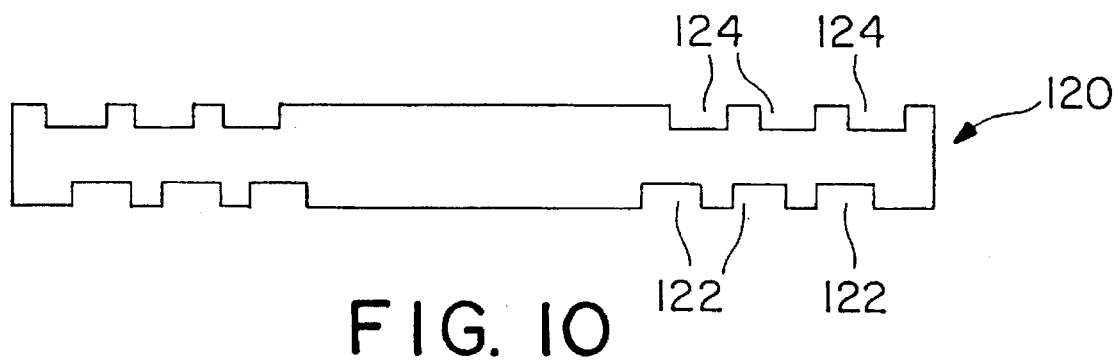
FIG. 10 is a cross-sectional view of a spacer in accordance with a further embodiment of the invention.
Figure 11:
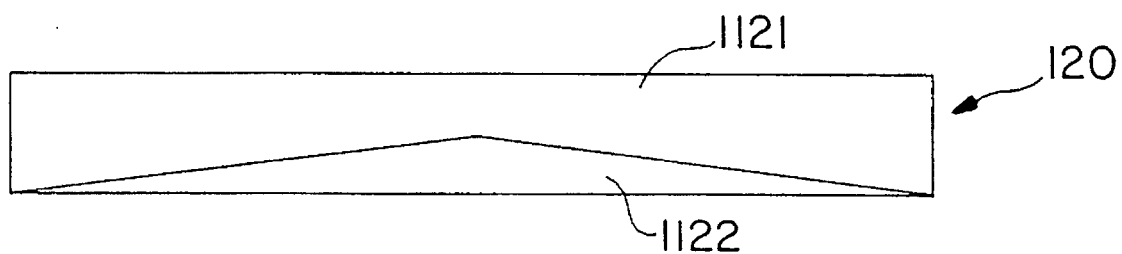
FIG. 11 is a cross-sectional view of a spacer in accordance with a further embodiment of the invention.

In FIGS. 3–8, the grooves are illustrated as being in one surface of the spacer, but it will be understood that other configurations can be provided, for example as shown in FIG. 9 where both surfaces of the spacer have grooves, the grooves on the bottom being labelled 122. As shown in FIG. 10, the grooves on opposing sides of the spacer need not necessarily align in radial position. Also, it will be understood that other means can be provided for obtaining a radial thermal conductivity variation in the spacer. For example, the grooves may be filled with a material, such as a ceramic, metal, graphite or gas, having a different thermal conductivity than the original spacer material. [It will be understood that, as a heat transfer mechanism in the spacer embodiments hereof, conduction will generally dominate over convection or radiation.] Alternatively, a tapered configuration, such as that shown in FIG. 11, could be employed. As an example, the material 1122 can have a higher thermal conductivity than the material 1121, which will result in a higher thermal conductance toward the center of the spacer 120.

Figure 12:
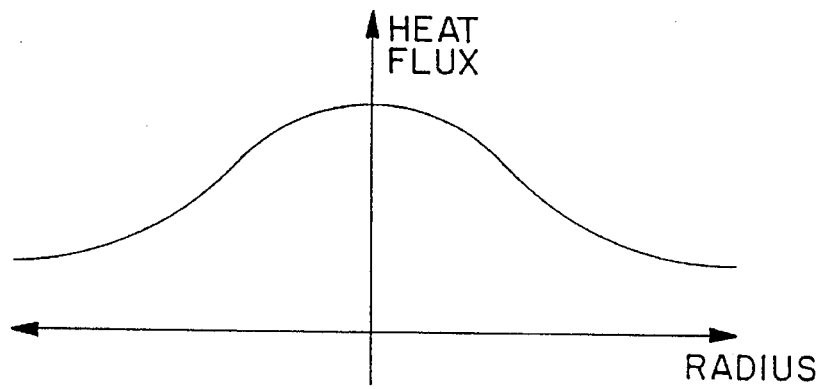
FIG. 12 illustrates an example of a graph of incoming heat flux as a function of radial dimension on the substrate disc surface.
Figure 13:
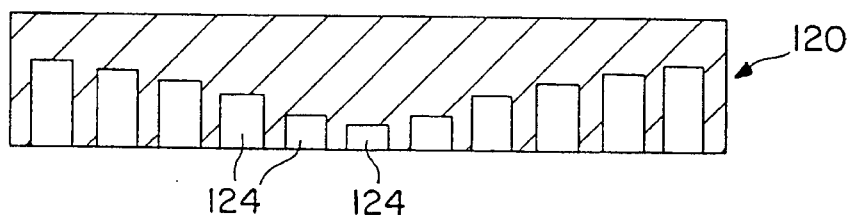
FIG. 13–15 are cross-sectional views of spacers having conductances, in the thickness direction, that vary non-linearly with radial dimension, and are inversely matched to the heat flux characteristic of FIG. 12.
Figure 14:
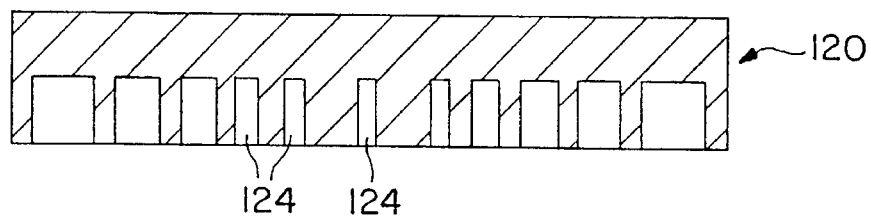
Figure 15:
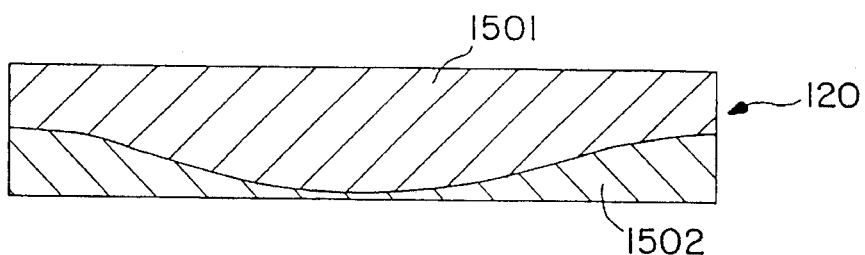

FIGS. 12–15 illustrate further embodiments hereof wherein the thermal conduction of the spacer in its thickness direction, as a function of radial dimension, can be selected to obtain a generally uniform temperature at the deposition surface by providing a thermal conduction in the thickness direction, as a function of radial dimension, that is substantially the inverse of the radial heat flux pattern at the deposition surface. For example, FIG. 12 illustrates a typical gaussian bell-shaped distribution of incoming heat flux (such as in units of watts per $cm^2$) as a function of radial dimension on the substrate disc surface at which deposition is taking place. FIGS. 13, 14, and 15 illustrate embodiments of spacers (120) which have thermal conduction in their thickness direction, as a function radial dimension, that is an inverse of the heat flux at the deposition surface. Accordingly, these spacers can be used to promote a generally uniform temperature at the deposition surface of the substrate during plasma deposition. In the embodiment of FIG. 13, the thermal conduction characteristic is obtained by using equally spaced grooves (124), with groove depths increasing (non-linearly, in this case) as a function of radial dimension. In the embodiment of FIG. 14, the depths of grooves (124) are the same, but groove widths are increased (again, non-linearly for this case) as a function of radial dimension. In the embodiment of FIG. 15, the spacer 120 has an upper region 1501 formed of a relatively higher thermal conductivity material, and a lower region 1502 formed of a relatively lower thermal conductivity material, so that, again, the thermal conduction in the thickness direction will decrease as a function of radial dimension in a non-linear fashion. The interface curve between the materials can be selected to obtain the desired conductance to be the inverse of the heat flux characteristic. As one example, the material 1501 may be molybdenum, and the material 1502 may be graphite of a type having lower thermal conductivity than molybdenum.

Figure 16:
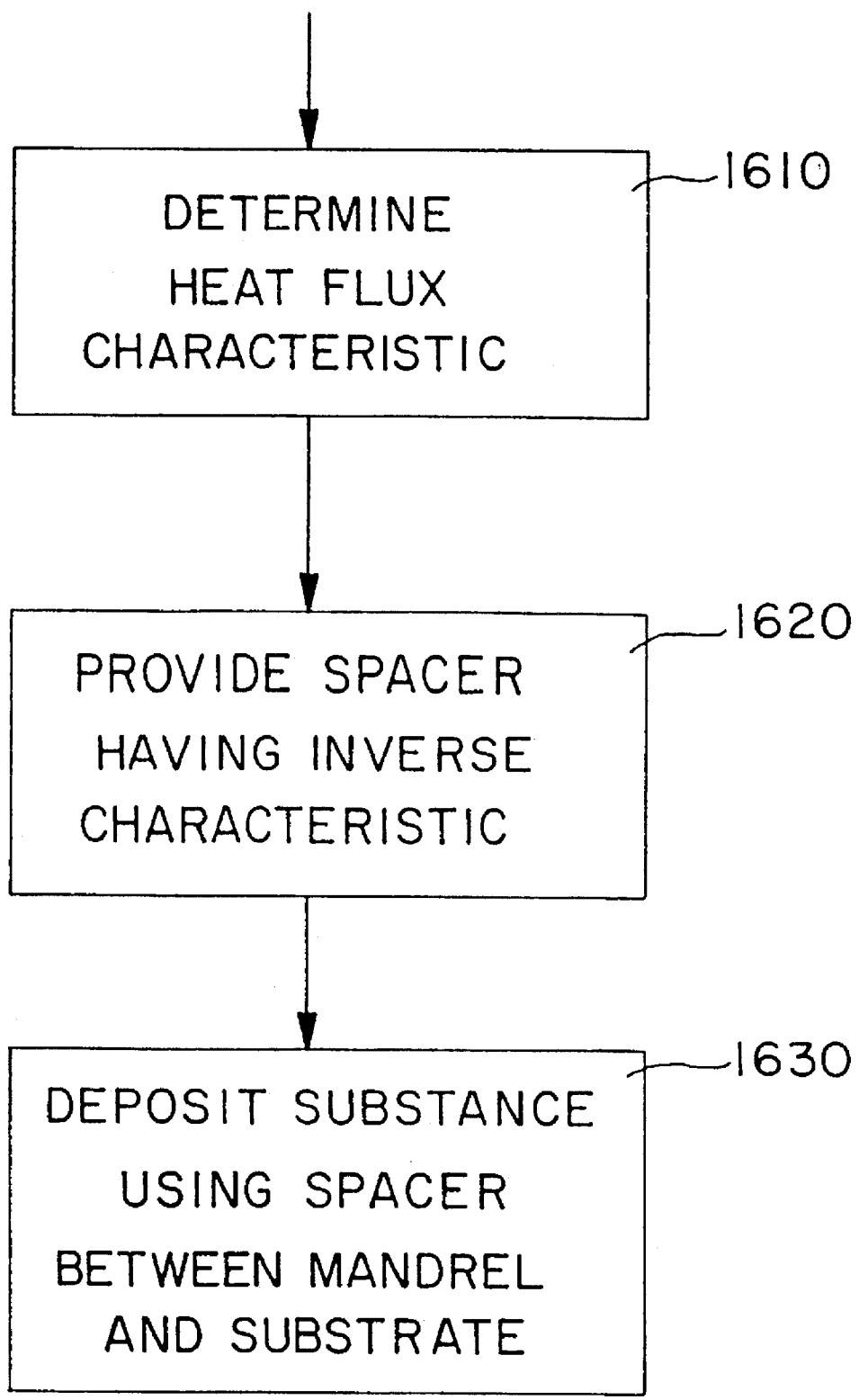
FIG. 16 is an operational flow diagram of a method in accordance with an embodiment of the invention.

FIG. 16 illustrates an operational flow diagram of the steps for practicing an embodiment of a method hereof. The block 1610 represents the determining of the incoming heat flux characteristic at the deposition surface as a function of radial dimension. The incoming heat flux pattern can be determined, for example, by measuring temperature using known pyrometer or spectroscopy techniques, or from direct measurement of temperature at the substrate surface. The block 1620 represents providing of a spacer having a thermal conduction in its thickness direction, as a function of radial dimension, that is an inverse of the determined heat flux characteristic. Then, with the spacer provided between the cooled mandrel and the substrate, the block 1630 represents deposition of the substance to be deposited, synthetic diamond being a substance of particular interest herein.

Figure 17:
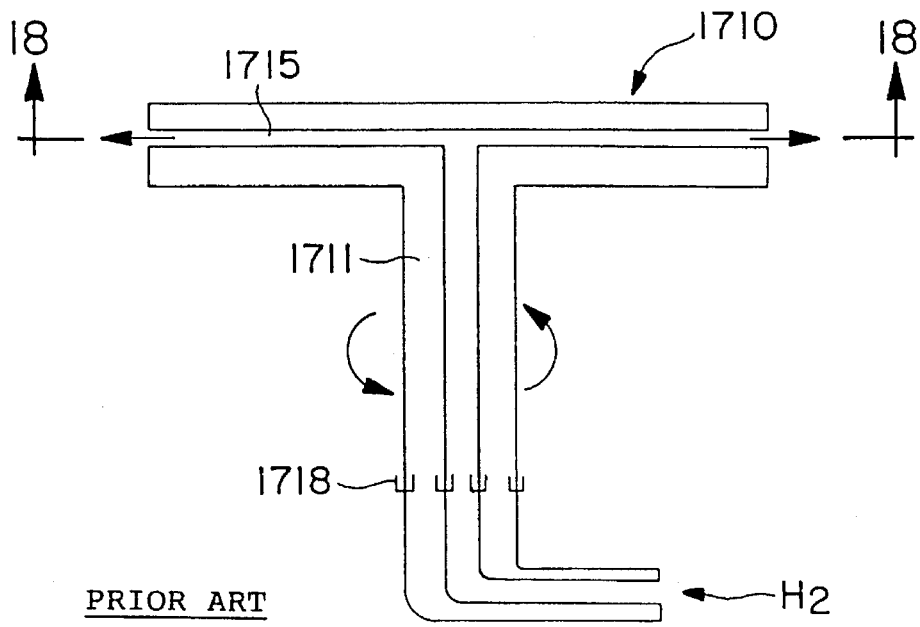
FIG. 17 is a side sectional view of a temperature controlled rotatable mandrel.
Figure 18:
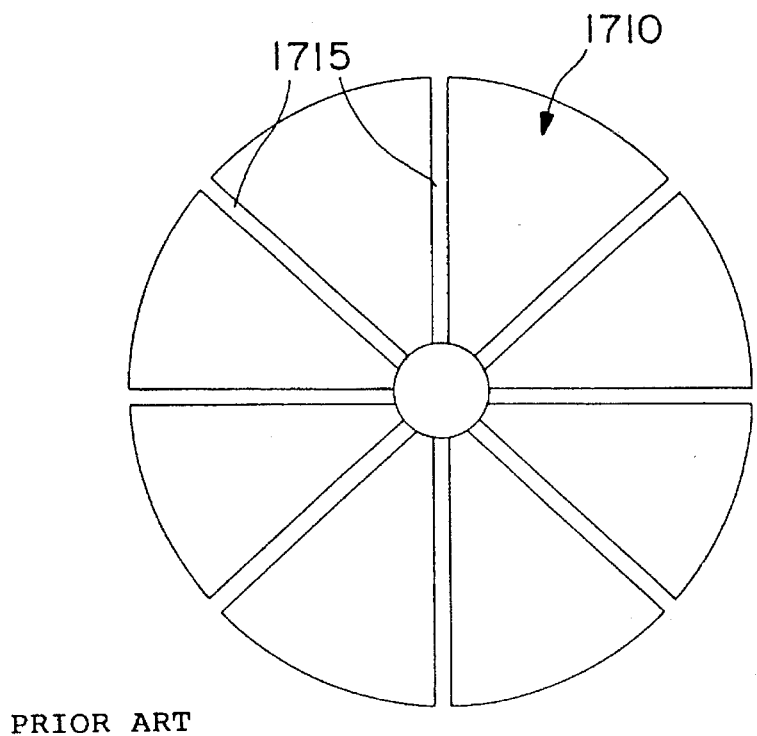
FIG. 18 is a cross-sectional view of the mandrel of FIG. 17, as taken through a section defined by arrows 17—17 of FIG. 17.

In further disclosed configurations a fluid coolant is utilized in a mandrel in an advantageous way. FIGS. 17 and 18 illustrate a configuration, which can be used, for example, in the plasma jet deposition system of FIG. 2, wherein coolant fluid is passed radially through a mandrel 1710 via radial bores 715, leaves the mandrel through peripheral openings, and enters the environment of the deposition chamber. By using a fluid that is normally contained in the environment, in this case hydrogen gas, the need to return coolant fluid through the mandrel is eliminated. This is particularly advantageous for a rotating mandrel, in that one need only provide for traversal of the gas one way through the mandrel, its rotating shaft 1711, and the rotary union 1718. The hydrogen gas, as the major constituent of the chamber environment, is eventually evacuated by the vacuum system (FIG. 2). The configuration of FIGS. 17 and 18 is prior art.

Figure 19:
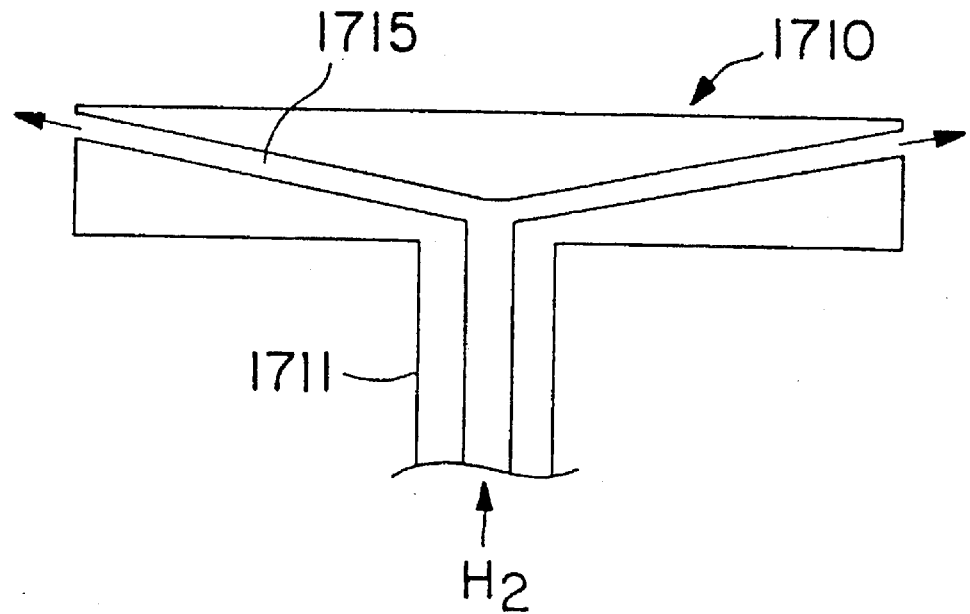
FIG. 19 is a side cross-sectional view of a temperature controlled rotatable mandrel in accordance with another embodiment of the invention.
Figure 20:
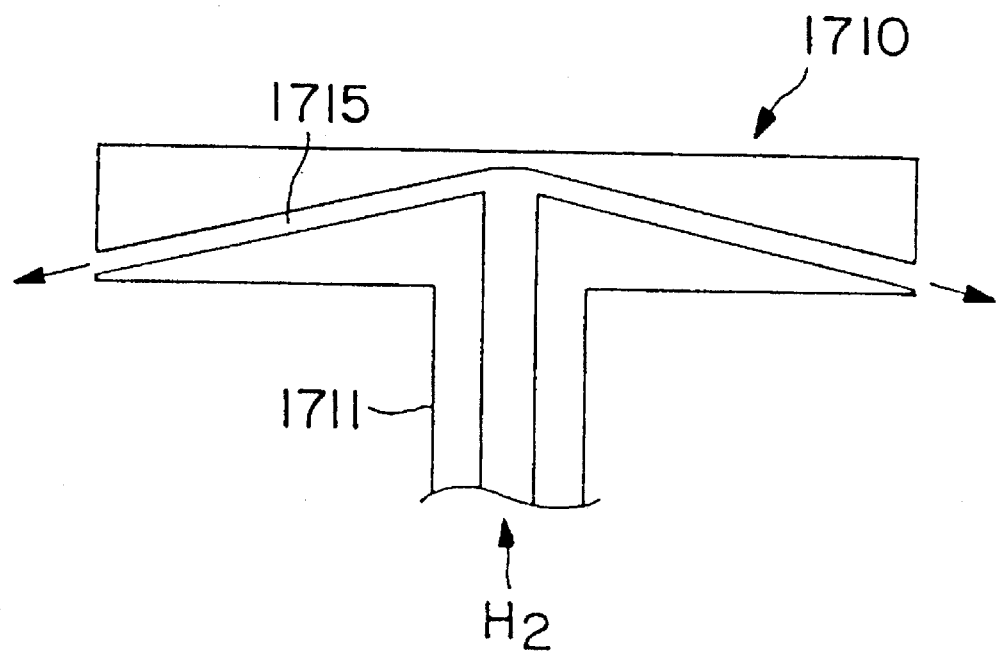
FIG. 20 is a slide cross-sectional view of a temperature controlled rotatable mandrel in accordance with another embodiment of the invention.

The configuration illustrated in FIGS. 17 and 18 will tend to provide more cooling toward the center of the mandrel since the spacing between coolant-carrying bores increases as a function as radial position. For applications where greater cooling is needed toward the mandrel center to obtain temperature uniformity (e.g. for deposition on the mandrel surface or on a substrate mounted on the mandrel or on a spacer), this configuration may be suitable. The radial cooling characteristic can be tailored for a particular application by selecting the taper angle of the bores 1715 with respect to the deposition surface. For example, FIG. 19 illustrates a configuration wherein the coolant-carrying bores taper toward the deposition surface as they extend radially, this configuration producing more cooling toward the periphery of the deposition surface than the one shown in FIGS. 17 and 18. The opposite type of taper is shown in FIG. 20, which will tend to provide relatively less cooling toward the periphery of the deposition surface.

The invention has been described with reference to particular preferred embodiments, but variations within the spirit and scope of the invention will occur to those skilled in the art. For example, it will be understood that other materials can be used, and that the principles hereof are applicable to other deposition techniques.

We claim:

1. Apparatus for depositing a substance, comprising:
a mandrel rotatable on an axis;
a spacer mounted on said mandrel;
a substrate mounted on said spacer;
means for directing, toward said substrate, a plasma containing constituents of the substance being deposited;
said spacer having a thermal conductance in its thickness direction that varies by increasing or decreasing with radial dimension.

2. Apparatus as defined by claim 1, wherein said thermal conductance of said spacer in the thickness direction varies by at least 5 percent from minimum to maximum.

3. Apparatus as defined by claim 2, wherein said spacer comprises a disc having concentric grooves therein.

4. Apparatus as defined by claim 2, wherein said disc is formed of a material selected from a metal, graphite, and a ceramic.

5. Apparatus as defined by claim 1, wherein said spacer comprises two materials having different thermal conductivities.

6. Apparatus as defined by claim 1, wherein said thermal conductance of said spacer in the thickness direction is relatively higher near the center of said spacer and relatively lower near the periphery of said spacer.

7. Apparatus as defined by claim 1, wherein said thermal conductance of said spacer in the thickness direction is relatively lower near the center of said spacer and relatively higher near the periphery of said spacer.

8. Apparatus as defined by claim 2, wherein said thermal conductance of said spacer in the thickness direction is relatively lower near the center of said spacer and relatively higher near the periphery of said spacer.

9. Apparatus as defined by claim 1, wherein said mandrel is cooled with a heat exchange fluid.

10. Apparatus as defined by claim 1, wherein said thermal conductance varies non-linearly with radial dimension.

11. Apparatus as defined by claim 1, wherein said thermal conductance varies inversely with the radial heat flux characteristic of said plasma at said substrate.

12. Apparatus for depositing diamond film, comprising:
a deposition chamber;
a mandrel, in said deposition chamber, that is rotatable on an axis;
means for rotating said mandrel on said axis;
means for cooling said mandrel with a heat exchange fluid;
a spacer mounted on said mandrel;
a substrate mounted on said spacer;
means for directing toward said substrate a plasma formed from constituents that include a hydrocarbon gas and hydrogen;
said spacer having a thermal conductance in its thickness direction that varies by increasing or decreasing with radial dimension.

13. Apparatus as defined by claim 12, wherein said thermal conductance of said spacer in the thickness direction varies by at least 5 percent from minimum to maximum.

14. Apparatus as defined by claim 13, wherein said spacer comprises a disc having concentric grooves therein.

15. Apparatus as defined by claim 12, wherein said spacer comprises two materials having different thermal conductivities.

16. Apparatus as defined by claim 12, wherein said thermal conductance of said spacer in the thickness direction is relatively lower near the center of said spacer and relatively higher near the periphery of said spacer.

17. Apparatus as defined by claim 1, wherein said mandrel is cooled with a heat exchange fluid.

18. Apparatus as defined by claim 12, said thermal conductance varies non-linearly with radial dimension.

19. Apparatus as defined by claim 12, wherein said thermal conductance varies inversely with the radial heat flux characteristic of said plasma at said substrate.

* * * * *